(12) United States Patent
West et al.

(10) Patent No.: US 10,714,321 B2
(45) Date of Patent: *Jul. 14, 2020

(54) SPUTTERING TARGET WITH BACKSIDE COOLING GROOVES

(71) Applicant: Applied Materials, Inc., Santa Clara, CA (US)

(72) Inventors: Brian T. West, San Jose, CA (US); Michael S. Cox, Gilroy, CA (US); Jeonghoon Oh, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/048,919

(22) Filed: Jul. 30, 2018

(65) Prior Publication Data

US 2018/0342378 A1 Nov. 29, 2018

Related U.S. Application Data

(63) Continuation of application No. 15/715,859, filed on Sep. 26, 2017, now Pat. No. 10,049,863, which is a (Continued)

(51) Int. Cl.
*H01J 37/34* (2006.01)
*C23C 14/34* (2006.01)
*C23C 14/35* (2006.01)

(52) U.S. Cl.
CPC ...... *H01J 37/3405* (2013.01); *C23C 14/3407* (2013.01); *C23C 14/35* (2013.01); (Continued)

(58) Field of Classification Search
CPC .............. H01J 37/3405; H01J 37/3423; H01J 37/3426; H01J 37/3429
(Continued)

(56) References Cited

U.S. PATENT DOCUMENTS 5,009,765 A  4/1991  Qamar et al.
5,687,600 A  11/1997  Emigh et al.
(Continued)

FOREIGN PATENT DOCUMENTS

CN  1690246 A  11/2005
CN  101213319 A  7/2008
(Continued)

OTHER PUBLICATIONS

Office Action and Search Report in Chinese Application No. 20140042023.7 dated May 22, 2017.
(Continued)

*Primary Examiner* — Rodney G McDonald
(74) *Attorney, Agent, or Firm* — Patterson + Sheridan, LLP

(57) ABSTRACT

Implementations of the present disclosure relate to a sputtering target for a sputtering chamber used to process a substrate. In one implementation, a sputtering target for a sputtering chamber is provided. The sputtering target comprises a sputtering plate with a backside surface having radially inner, middle and outer regions and an annular-shaped backing plate mounted to the sputtering plate. The backside surface has a plurality of circular grooves which are spaced apart from one another and at least one arcuate channel cutting through the circular grooves and extending from the radially inner region to the radially outer region of sputtering plate. The annular-shaped backing plate defines an open annulus exposing the backside surface of the sputtering plate.

20 Claims, 5 Drawing Sheets

Related U.S. Application Data continuation of application No. 14/456,014, filed on Aug. 11, 2014, now Pat. No. 9,779,920.

(60) Provisional application No. 61/866,006, filed on Aug. 14, 2013.

(52) U.S. Cl.
CPC ........ *H01J 37/347* (2013.01); *H01J 37/3423* (2013.01); *H01J 37/3426* (2013.01); *H01J 37/3429* (2013.01); *H01J 37/3435* (2013.01); *H01J 37/3491* (2013.01); *H01J 37/3497* (2013.01)

(58) Field of Classification Search
USPC .......................... 204/298.09, 298.12, 298.13
See application file for complete search history.

(56) References Cited

U.S. PATENT DOCUMENTS

| | | | |
|---|---|---|---|
| 6,117,281 | A | 9/2000 | Novbakhtian |
| 7,901,552 | B2 | 3/2011 | Pavloff |
| 8,435,392 | B2 | 5/2013 | Hawrylchak et al. |
| 8,647,484 | B2 | 2/2014 | Ritchie et al. |
| 8,790,499 | B2 | 7/2014 | Young et al. |
| 9,779,920 | B2 * | 10/2017 | West .................. H01J 37/3405 |
| 2005/0236270 | A1 | 10/2005 | Cheng et al. |
| 2006/0032740 | A1 | 2/2006 | Willson et al. |
| 2006/0260936 | A1 | 11/2006 | Hort et al. |
| 2007/0125646 | A1 | 6/2007 | Young et al. |
| 2007/0141857 | A1 | 6/2007 | Strothers et al. |
| 2007/0170052 | A1 | 7/2007 | Ritchie et al. |
| 2007/0173059 | A1 | 7/2007 | Young et al. |
| 2008/0308416 | A1 | 12/2008 | Allen et al. |
| 2009/0090620 | A1 | 4/2009 | Pavloff |
| 2010/0213048 | A1 | 8/2010 | Endo et al. |

FOREIGN PATENT DOCUMENTS

| | | |
|---|---|---|
| CN | 100473756 C | 4/2009 |
| CN | 101680082 A | 3/2010 |
| CN | 101824600 A | 9/2010 |
| CN | 1982501 B | 4/2011 |
| CN | 201999986 U | 10/2011 |
| CN | 102560401 A | 7/2012 |
| EP | 1589129 A1 | 10/2005 |
| JP | 2010537043 A | 12/2010 |
| TW | 200732491 | 1/2007 |
| TW | 200706670 A | 2/2007 |
| WO | 2004038059 A2 | 5/2004 |
| WO | 2006119367 A2 | 11/2006 |

OTHER PUBLICATIONS

Extended European Search Report for European Application No. 14835827 dated Feb. 27, 2017.
International Search Report and Written Opinion for International Application No. PCT/US2014/050539 dated Nov. 12, 2014.
Office Action for U.S. Appl. No. 14/456,014 dated Dec. 4, 2015.
Office Action for U.S. Appl. No. 14/456,014 dated Nov. 10, 2016.
Final Office Action for U.S. Appl. No. 14/456,014 dated May 31, 2016.
European Office Action for European Application No. 14835827.8 dated Jan. 23, 2018.
Japanese Office Action dated May 14, 2018 for Application No. 2016-534774.
Office Action in related application CN 20140042023.7 dated May 22, 2017.
Extended European Search Report in related application EP 14835827 dated Feb. 27, 2017.
Office Action for Chinese Application No. 201810646078.9 dated Nov. 18, 2019.
Search Report for Chinese Application No. 201810646078.9 dated Nov. 5, 2019.
Notice of Allowance for Taiwan Application No. 108122515 dated Jan. 17, 2020.
Search Report for Taiwan Application No. 108122515 dated Jan. 16, 2020.

* cited by examiner

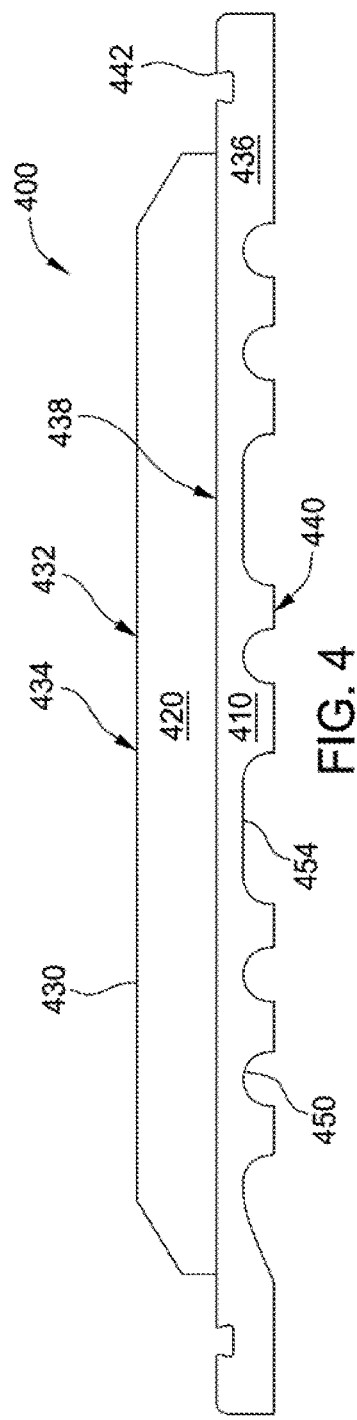
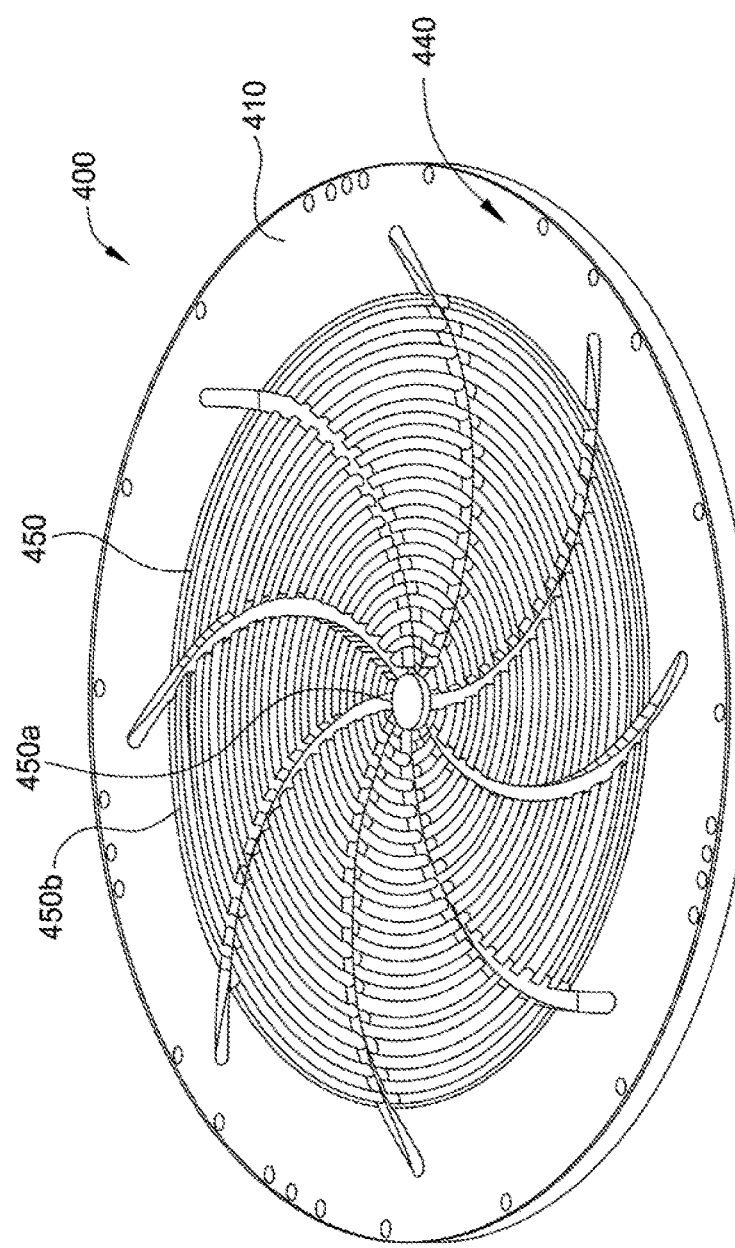

SPUTTERING TARGET WITH BACKSIDE COOLING GROOVES

CROSS-REFERENCE TO RELATED APPLICATIONS

This application is a continuation of U.S. patent application Ser. No. 15/715,859, filed Sep. 26, 2017, which is a continuation of U.S. patent application Ser. No. 14/456,014, filed Aug. 11, 2014, now U.S. Pat. No. 9,779,920, which claims benefit of U.S. Provisional Patent Application Ser. No. 61/866,006, filed Aug. 14, 2013. The aforementioned related patent applications are herein incorporated by reference in their entirety.

BACKGROUND

Field

Implementations of the present disclosure relate to a sputtering target for a sputtering chamber used to process a substrate.

Description of the Related Art

A sputtering chamber is used to sputter deposit material onto a substrate in the fabrication of integrated circuits and displays. Typically, the sputtering chamber comprises an enclosure around a sputtering target facing a substrate support, a process zone into which a process gas is introduced, a gas energizer to energize the process gas, and an exhaust port to exhaust and control the pressure of the process gas in the chamber. The sputtering target is bombarded by energetic ions formed in the energized gas causing material to be knocked off the sputtering target and deposited as a film on the substrate. The sputtered material can be a metal, such as for example, aluminum, copper, tungsten, titanium, cobalt, nickel or tantalum; or a metal compound, such as for example, tantalum nitride, tungsten nitride or titanium nitride.

In certain sputtering processes, a magnetic field generator provides a shaped magnetic field about the sputtering surface of the sputtering target to improve sputtering properties and the sputtering surface of the sputtering target. For example, in magnetron sputtering, a set of rotatable magnets rotate behind the sputtering targets to produce a magnetic field about the front surface of the sputtering target. The rotating magnetic field provides improved sputtering by controlling the rate of sputtering across the sputtering target.

A cooling system passes heat transfer fluid through a housing surrounding the rotatable magnets to cool the magnets and the underlying sputtering target. However, conventional cooling systems often fail to remove sufficiently high levels of heat from the sputtering target and/or fail to provide spatially uniform heat removal from the sputtering target. As a result, hotter regions of the sputtering target are often sputtered at higher sputtering rates than adjacent regions, resulting in uneven sputtering across the surface of the sputtering target. Uneven target sputtering in combination with a rotating magnetic field can cause a sputtering target to develop a sputtering surface having erosion grooves and microcracks that extend downward from the erosion grooves can also form. The localized microcracks, which occur at the erosion grooves, can result in the ejection of sputtered particles during the sputtering process, which then deposit on the substrate to reduce yields. Sputtered particles that land on chamber components can also flake off at a later time due to thermal stresses arising from heating and cooling cycles.

Thus, it is desirable to have a sputtering target capable of being more efficiently, and more uniformly, cooled by a target cooling system. It is also desirable for the sputtering target to exhibit reduced localized cracking from thermal stresses.

SUMMARY

Implementations of the present disclosure relate to a sputtering target for a sputtering chamber used to process a substrate. In one implementation, a sputtering target for a sputtering chamber is provided. The sputtering target comprises a sputtering plate with a backside surface having radially inner, middle and outer regions and an annular-shaped backing plate mounted to the sputtering plate. The backside surface has a plurality of circular grooves, which are spaced apart from one another and at least one arcuate channel cutting through the circular grooves and extending from the radially inner region to the radially outer region of the sputtering plate. The annular-shaped backing plate defines an open annulus exposing the backside surface of the sputtering plate.

In another implementation, a sputtering chamber is provided. The sputtering chamber comprises a sputtering target mounted in the sputtering chamber, a substrate support facing the sputtering target, a gas distributor to introduce a gas into the sputtering chamber, a gas energizer to energize the gas to form a plasma to sputter the sputtering target and a gas exhaust port to exhaust gas from the sputtering chamber. The sputtering target comprises a sputtering plate with a backside surface having radially inner, middle and outer regions and an annular-shaped backing plate mounted to the sputtering plate, wherein the annular-shaped backing plate defines an open annulus exposing the backside surface of the sputtering plate. The backside surface has a plurality of circular grooves, which are spaced apart from one another and at least one arcuate channel cutting through the circular grooves and extending from the radially inner region to the radially outer region of sputtering plate.

In yet another implementation, a magnetron sputtering target assembly is provided. The magnetron sputtering target assembly comprises (a) a heat exchanger housing capable of holding heat transfer fluid about a plurality of rotatable magnets, (b) a sputtering target abutting the housing such that the heat transfer fluid contacts a backside surface of the sputtering target, and (c) a sputtering plate mounted on the front surface of the backing plate. The sputtering target comprises a backing plate having the backside surface, the backside surface including radially inner, middle and outer regions, wherein the radially middle region has a plurality of concentric circular grooves located at the backside surface and a plurality of concentric circular grooves located at the radially middle region of the backside surface, and a plurality of arcuate channels extending from the radially inner region to the radially outer region of the backside surface. At least one of the backing plate and the sputtering plate comprise a material selected from Al0.5Cu, Al1.0Si, Al0.5Cu1.0Si, pure aluminum, copper, chrome, titanium, tungsten, molybdenum, cobalt, tantalum, Li—P—O—N, germanium, $GeS_2$, silicon, $SiO_2$, quartz, combinations thereof.

BRIEF DESCRIPTION OF THE DRAWINGS

So that the manner in which the above-recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIG. 4 is a sectional side view of an implementation of a sputtering target comprising a sputtering plate mounted on a backing plate;

FIG. 5 is a perspective view of the back of the backing plate of FIG. 4 showing a plurality of intersection circular grooves and arcuate channels on the backside surface of the backing plate.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations of the present disclosure relate to a sputtering target for a sputtering chamber used to process a substrate. Extraction of process chamber heat from sputtering targets is crucial to avoid uneven sputtering across the surface of the sputtering target. Normally, sputtering targets are cooled by having the backside (non-chamber side) exposed to cooling fluids (e.g., DI water) housed in the magnetron cavity. Given the spacing of the magnetron at ~1 mm behind the sputtering target and with the magnetron spinning at ~60 RPM (depending on magnetron design) there may be only a thin layer of water in contact with the backside of the sputtering target. This thin layer of water is being spun out centrifugally away from the center of the sputtering target, which leads to overheating of the center area of the sputtering target, which will degrade sputtered film performance. In some implementations, grooves are added to the backside of the sputtering target to allow deeper water films to be present and to use the centrifugal action of the magnetron to flush heated water out of the center to be replaced with cooler water.

Certain implementations described herein can also be applied to rectangular or other shaped targets with groove profiles designed to be appropriate for those shapes. Certain implementations described herein have the advantage of greatly increased cooling for the active parts of a sputter target. This increased cooling can then be utilized to allow far larger power densities in the process chambers for improvements in productivity, deposition rate, and deposition properties. Further, the implementations described herein may be used to cool any thermally conductive plate where heat is applied to one side and a coolant fluid is applied to the opposite side.

In certain implementations, the materials of both the backing plate and the sputtering target deposition materials are different. In certain implementations, the backing material of the sputtering material can be any appropriate metal such as aluminum and aluminum alloys (e.g., 6061, 2024, 99.5% Al/0.5% Cu), copper, OFE copper, copper alloys (copper/chrome alloys, copper/zinc alloys, copper/tin alloys) or other thermally conductive metals. In certain implementations, the backing plate may be flat or dished.

Other, exemplary materials for at least one of the backing plate and the sputtering plate comprise materials selected from Al0.5Cu (wt. %) alloy, Al1.0Si (wt. %) alloy, Al0.5Cu1.0Si (wt. %) alloy, pure aluminum, copper, chrome, titanium, tungsten, molybdenum, cobalt, tantalum, Li—P—O—N, germanium, $GeS_2$, silicon, $SiO_2$, quartz, combinations thereof and alloys thereof.

Figure 1:
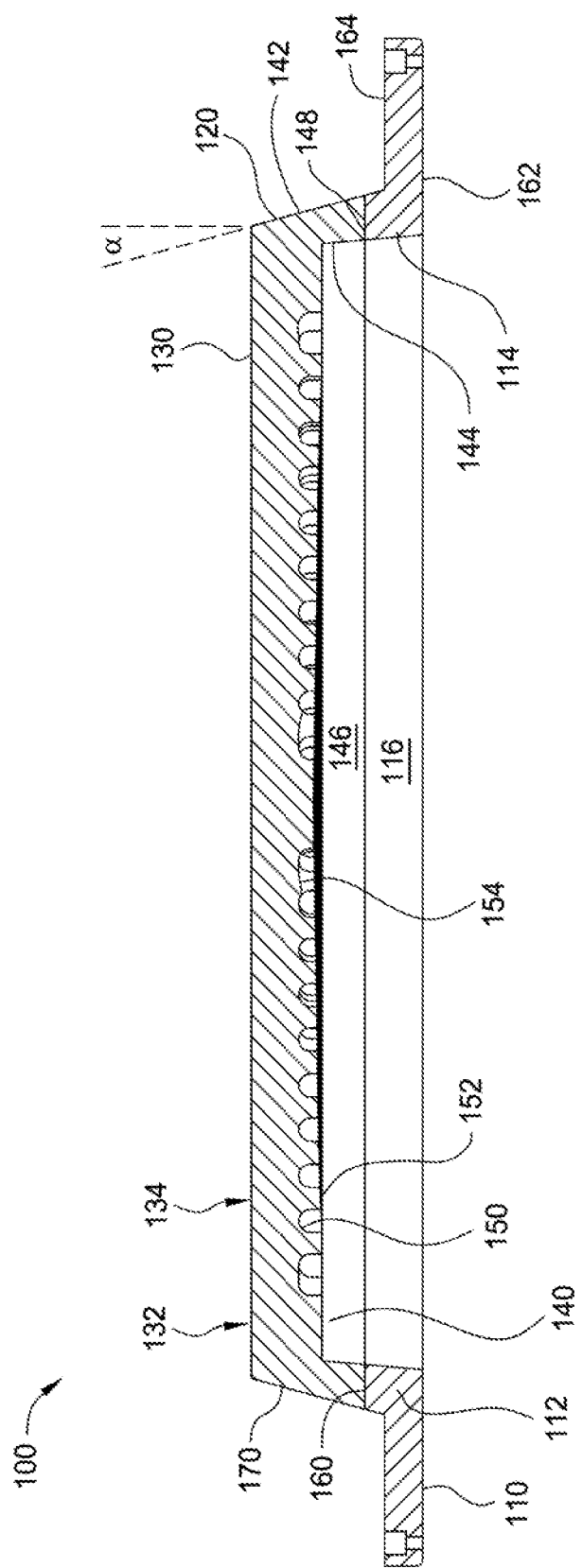
FIG. 1 is a sectional side view of an implementation of a sputtering target comprising a sputtering plate mounted on a backing plate.

An exemplary implementation of a sputtering target 100 that can be used in a sputtering process chamber (e.g., process chamber 600) to deposit sputtered material on a substrate (e.g., substrate 602) with reduced erosion of grooves and microcracking, is shown in FIGS. 1 to 6. Referring to FIG. 1, in one implementation, the sputtering target 100 comprises a backing plate 110 and a sputtering plate 120. The sputtering plate 120 and the backing plate 110 can be a monolith comprising a single structure made from the same high-purity material and that serves as both a backing plate and a sputtering plate or they may be separate structures that are bonded together to form a sputtering target.

The sputtering plate 120 comprises a central cylindrical mesa 130 that serves as a sputtering surface 134, a backside surface 140 opposing the sputtering surface 134, a back surface 148 opposite the sputtering surface 134, an outer peripheral wall 142 and an inner peripheral wall 144. The outer peripheral wall 142 and the inner peripheral wall 144 may be cylindrical and both may be inclined slightly. The outer peripheral wall 142 extends from the sputtering surface 134 to the back surface 148. The inner peripheral wall 144 extends from the backside surface 140 to the back surface 148. As shown in FIG. 1, a recess 146 is formed between the backside surface 140 and the inner peripheral wall 144. The recess 146 exposes the backside surface 140 of the sputtering plate 120.

The sputtering surface 134 has a top plane 132 that is maintained parallel to the plane of a substrate 602 during use of the sputtering target 100 in a chamber 600. The sputtering plate 120 is made from a metal or metal compound. For example, the sputtering plate 120 can be composed of, for example, at least one of aluminum, copper, cobalt, nickel, tantalum, titanium, tungsten and alloys thereof. The sputtering plate 120 can also be a metal compound, such as for example, tantalum nitride, tungsten nitride or titanium nitride. In one implementation, the sputtering plate 120 comprises titanium at a high purity level, for example, at least about 99.9%, or even at least about 99.99%. Additional metal and metal compounds for the sputtering plate 120 are disclosed in Table I.

In one implementation, the sputtering target 100 comprises the backside surface 140 that opposes the sputtering surface 134, and which has a pattern of circular grooves 150 (or 150a and 150b) and intersecting arcuate channels 154 (or 154a and 154b). The circular grooves 150 may extend from a radially inner region 122 of the sputtering plate 120 to a radially outer region 124 of the sputtering plate 120. The circular grooves 150 may be positioned in a radially middle region 126 formed between the radially inner region 122 and the radially outer region 124. The circular grooves 150 may have a radiused cross-section. The intersecting arcuate channels 154 cut through the circular grooves 150 at angles ranging from 60 to 90 degrees relative to the localized horizontal tangent to the circular groove 150 at the point of intersection. In some implementations, the arcuate channels 154 are spaced apart from one another by an angle of from about 30 to about 90 degrees as measured from the center of the backside surface of the sputtering plate 120. The intersecting arcuate channels 154 break up the continuous trench structure of the circular grooves 150 to allow heat transfer fluid to circulate between the circular grooves 150 at the intersection points. The intersecting arcuate channels 154 have been found to significantly reduce stagnation of fluid within the continuous trench structures of the circular grooves 150. Unexpectedly and surprisingly, the combination of the circular grooves 150 and intersecting arcuate channels 154 on the backside surface of the backing plate 110 were also found to substantially reduce the number of particles that deposit on a particular substrate during a sputtering process. The arcuate channels 154 may have a radiused cross-section.

In some implementations, linear channels may be used in place of arcuate channels 154. The linear channels may be spaced apart from one another by an angle of from about 30 to about 90 degrees as measured from the center of the backside surface of the sputtering plate 120. The linear channels may cut through the circular grooves 150 at angles ranging from 60 to 90 degrees relative to the localized horizontal tangent to the circular grooves 150 at each point of intersection. The linear channels may have the same angle as the mean of the arcuate channels 154.

It is believed that the reduction in particulate contamination from the sputtering target results from the effect of the intersecting grooves 150 and arcuate channels 154 on the fluid dynamics of the heat transfer fluid in the circular grooves 150 of the backside surface 140 of the sputtering target 100. Generally, the heat transfer fluid at the bottom and nearest the walls of the circular grooves 150 moves more slowly than the bulk of the fluid because of friction between the fluid and the surface. This frictional effect can create a stagnant layer of hot fluid at the bottom of the circular grooves 150 on the backside surface 140 that reduces circulation of heat transfer fluid through the grooves. On backing plates that do not have intersecting grooves and arcuate channels, the stagnant layer of fluid remains trapped in the circular grooves 150 without exposure to excessive amounts of turbulence. Moreover, the heat transfer fluid is typically circulated by a magnet assembly that rotates about a central axis in the housing, which increases the laminar flow of fluid through the circular grooves 150, further contributing to entrapping hot fluid within the circular grooves 150. It is believed that the intersecting grooves 150 and arcuate channels 154 break up the circular grooves 150 into shorter segments and provide corners at the intersections, about which the fluid flow is turbulent. This turbulence stirs the stagnant layer at the bottom of the circular grooves 150 to force this fluid out of the groove and allow fresh, unheated fluid to enter the groove. The quicker moving circulating fluid is believed to considerably reduce the thickness and insulating effect of the slow moving stagnant layer, thereby increasing the heat transfer between the sputtering plate 120 and the heat transfer fluid.

The circular grooves 150 and arcuate channels 154 also provide an increase in total surface area of the backside surface 140 of the sputtering plate 120. The grooved backside surface 140 can have a surface area that is from 50% to 120% greater than the surface area of a planar backside surface of a sputtering plate of similar dimensions. For example, if the surface area of the planar backside of a conventional sputtering plate is "A" $cm^2$, the area of the grooved sputtering plate 120 will be 1.5 A to 2.2 A.

Figure 2:
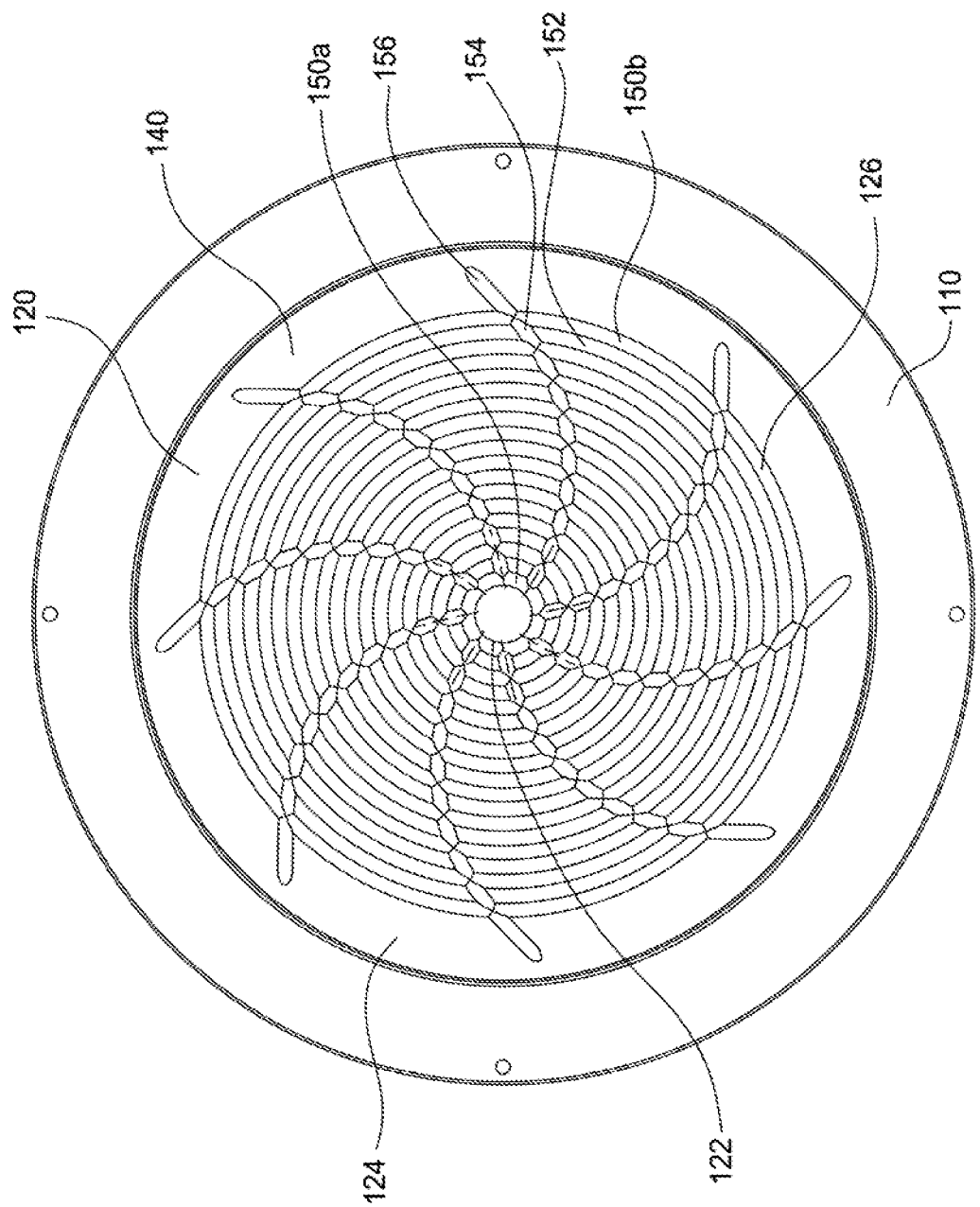
FIG. 2 is a perspective view of the back of the sputtering target showing a plurality of intersection circular grooves and arcuate channels on the backside surface of the sputtering plate.
Figure 3:
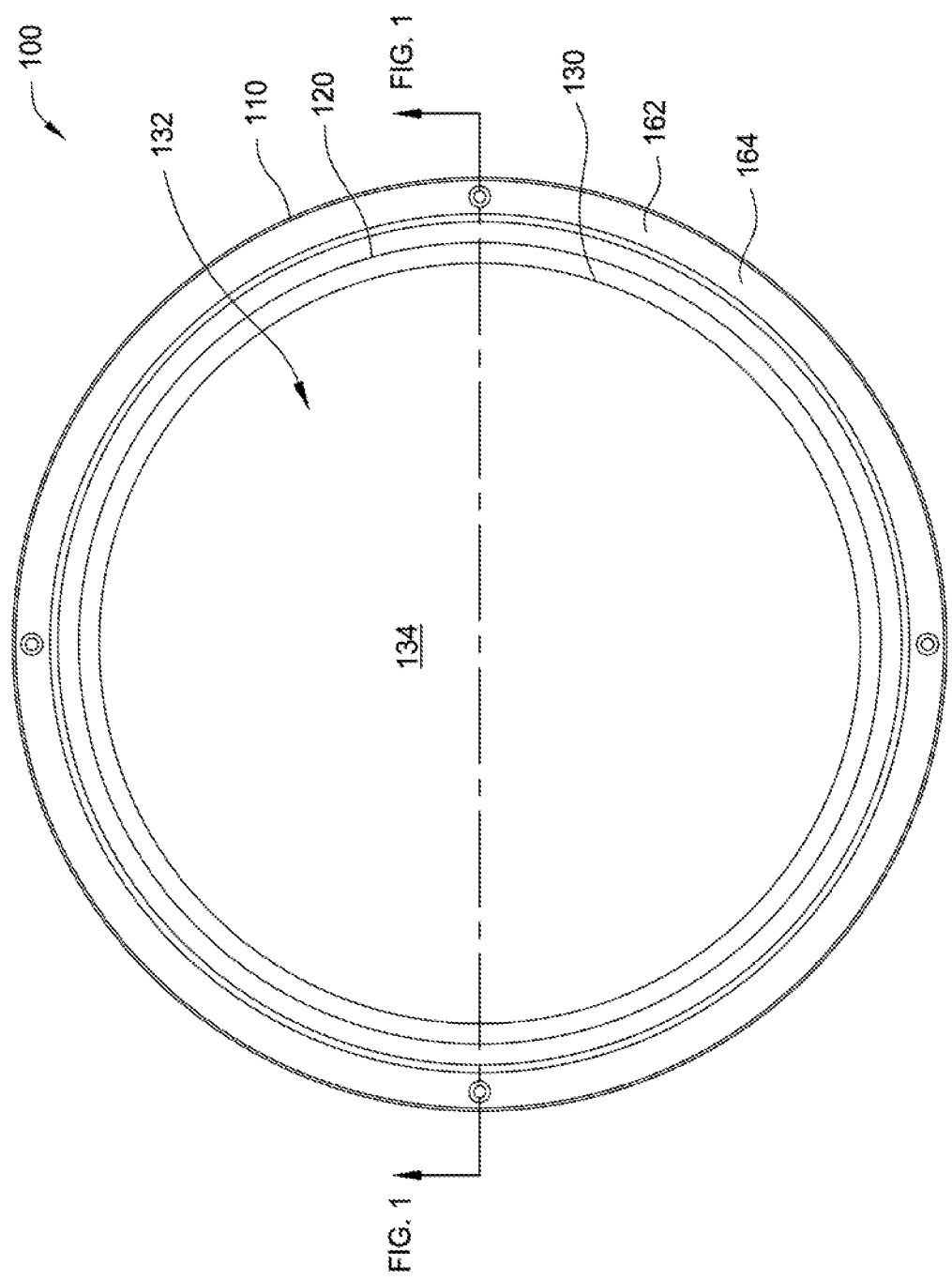
FIG. 3 is a top view of the front surface of the sputtering plate.

In one implementation, as shown in FIG. 2, the circular grooves 150 are spaced apart and concentric to one another. In one implementation, the number of circular grooves ranges from about 2 grooves to about 50 grooves. In another implementation, the number of circular grooves ranges from about 10 circular grooves to about 40 circular grooves. In another implementation, the number of circular grooves ranges from about 20 circular grooves to about 30 circular grooves. In another implementation, the number of grooves is about 20. In another implementation, the number of grooves is about 30. Those skilled in the art will realize that the number of grooves can vary depending on the fluid used and the specific application.

Each circular groove 150 comprises a $\Delta r$ (distance between the outer radius of a particular circular groove 150 and its inner radius) ranging from about 2 mm to about 10 mm. In one example, $\Delta r$ is about 6 mm. The circular ridges 152 between the circular grooves 150 have a width ranging from about 2 mm to about 10 mm. In one example, the circular ridges 152 between the circular grooves 150 have a width of about 6 mm. FIG. 2 shows the backside surface 140 having ten circular grooves 150, which are concentric and annular with eight intervening circular ridges 152.

The distribution of the circular grooves 150 and circular ridges 152 is selected to overlap with the rotational track of the rotating magnet assembly, such that the region over which the magnet rotates is almost entirely covered with circular grooves 150 and circular ridges 152. In one implementation, the circular grooves 150 are spread across an area of at least about 50% of the area of the backside surface 140, or even at least 75% of the backside surface 140, to maximize the effect of the circular grooves 150. The higher coverage area of the circular grooves 150, as compared to previous designs, serve to cooperatively dissipate additional heat from the backside surface 140 causing the whole sputtering target 100 to operate at cooler temperatures during sputter processing.

In one implementation, the circular grooves 150 comprise an innermost radially inner circular groove 150a and an outermost radially outer circular groove 150b, with a plurality of circular grooves 150 distributed between the inner and outer circular grooves 150a, 150b. The inner diameter of the inner circular groove 150a is selected in relation to the diameter of the shaft of the rotating magnet assembly and can even be the same diameter as the magnet assembly shaft. The inner circular groove 150a is situated directly under the shaft, and the radius of the outer circular groove 150b is selected in relation to the maximum radius of rotation of the magnet assembly about the rotation shaft. For example, the radius of the outer circular groove 150b can be selected to be substantially the same as the maximum radius of rotation of the magnet assembly about the rotation shaft. This grooved surface provides an increased cooling surface area in the region corresponding both to the circulated fluid and to the regions of the sputtering surface 134 that have magnetically enhanced sputtering and may have the need for further temperature control.

The arcuate channels 154 intersect the circular grooves 150 by cutting through the plurality of circular ridges 152 of the circular grooves 150. The arcuate channels 154 serve as drainage channels, which prevent stagnation of heat transfer fluid within the circular grooves 150 to substantially improve heat transfer from the pattern of intersecting circular grooves 150 and arcuate channels 154, respectively. The arcuate channels 154 comprise arcs, which are curved and extend primarily along the radial direction. The arcuate channels 154 are spaced apart from one another by a distance that varies across the radial direction, with a larger gap near the periphery of the backside surface 140 and a smaller distance closer to the center of the backside surface 140. In one implementation, as shown FIG. 2, the shape of each arcuate channel can be approximated by the polar equation:

$$r=\arcsin(\theta) \text{ for } 0<\theta<\pi/3.$$

Figure 6:
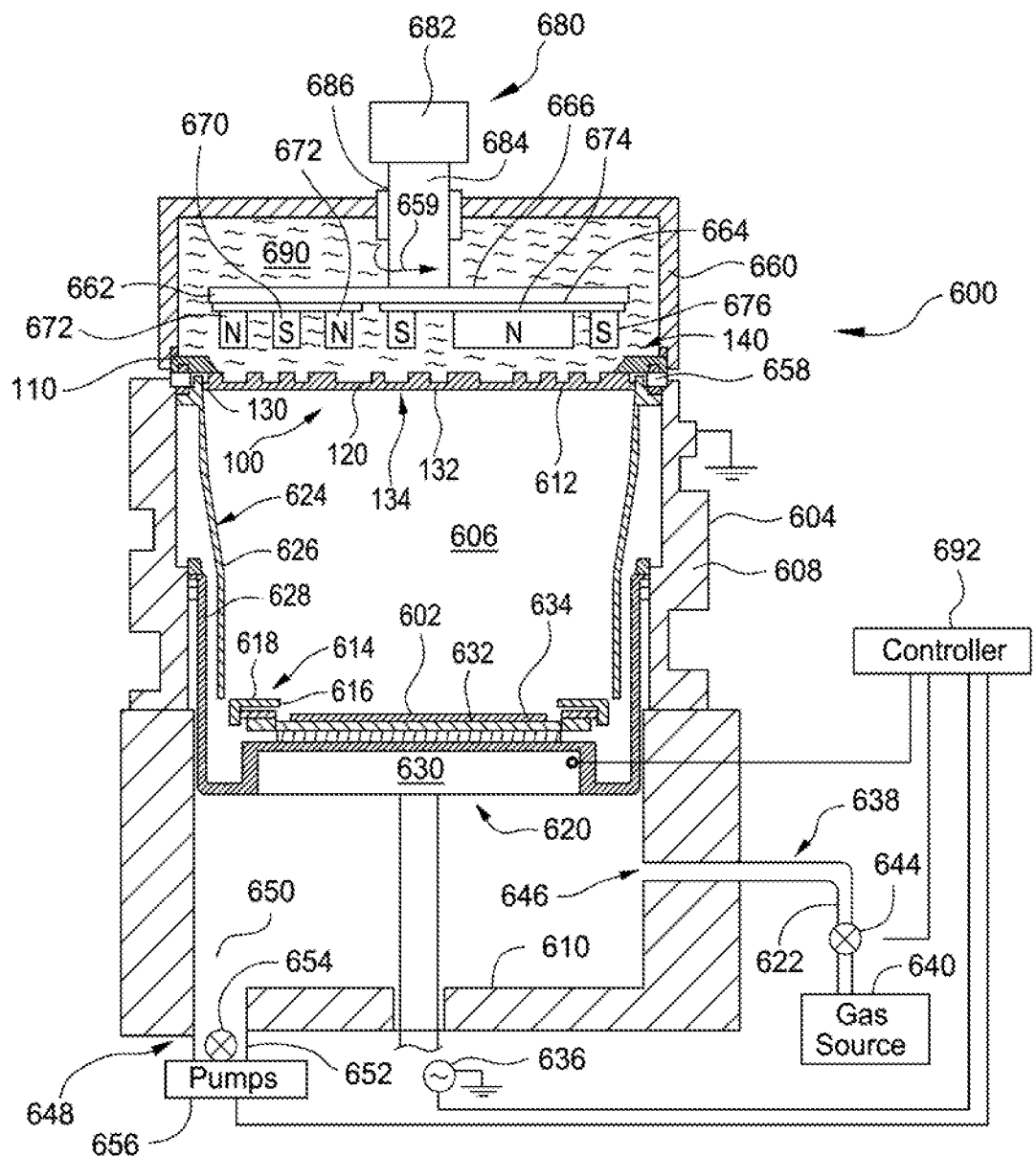
FIG. 6 is a schematic sectional side view of a sputtering chamber showing a heat exchanger enclosing a rotating magnetic assembly and the backside surface of a sputtering target.

In one implementation, the arcuate channels 154 are curved to be convex shaped relative to the direction of the rotating magnets in the chamber 600, as shown by the arrow 659 in FIG. 6. The shaped arcuate channels 154 prevent stagnation of heat transfer fluid within the circular grooves 150 by allowing heated fluid to escape from the circular grooves 150. The arcuate shape in this direction encourages laminar flow of the fluid through and from the circular grooves 150.

The arcuate channels 154 also can have a curved tip region 156 that tapers upward to the backside surface 140 of the backing plate 110, as shown in FIGS. 1 and 2. The curved tip region 156 begins at about the radius of the outer circular groove 150b. The tapered tip is preferable over a stepwise tip because the tapered tip allows for a more laminar flow of fluid out of the ends of the arcuate channels 154.

The circular grooves 150 and arcuate channels 154 can be formed by machining the backing plate 110, for example, cutting by a lathe or milling. The corners of the circular grooves 150 and resultant circular ridges 152 can also be rounded in the machining process, to reduce erosion and stress concentration at the corners.

The grooved sputtering target may be manufactured using a CNC milling and/or lathe machine. Once a target blank is formed ball end milling cutters (for the milling machine) or radiused or single point lathe cutters, and then a ball end mill (multi head lathe or mill) may be used to form the grooves. The circular grooves can be formed on a lathe, the spiral or arcuate channels may then be cut using a milling system or a multi-head lathe. On a standard CNC milling system all grooves can be cut using a ball end mill trepanning the circles and arcs. The grooves are typically cut to a sufficient depth to facilitate adequate cooling of the sputtering target without being so deep as to reduce the structural rigidity of the sputtering target when under process conditions. For a 200 mm aluminum target, for example, the grooves can be on the order of 0.25". For other target diameters and materials the groove size may be adjusted accordingly. For round targets circular grooves may be used because circular grooves are easy to manufacture and do not lead to uneven flexure of the sputtering target under vacuum loading. After, the spiral-arcuate-grooves may be added to facilitate center to edge water extraction aided by the spinning magnetron.

In one implementation, the sputtering plate 120 is mounted on the backing plate 110, which is a separate structure. The backing plate 110 has an annular-shaped body defined by a front surface 160, an inner peripheral wall 114 and an annular flange 162. The annular-shaped body 112 defines an open annulus 116. The annular-shaped body 112 is typically sized to surround the backside surface 140 of the sputtering plate 120 and expose the backside surface 140 via the open annulus 116. The front surface 160 supports the sputtering plate 120. The annular flange 162 extends beyond the radius of the sputtering plate 120. The annular flange 162 comprises a peripheral circular surface and has outer footing 164 that rests on an isolator 658 in the chamber 600, as shown in FIG. 6. The isolator 658 electrically isolates and separates the backing plate 110 from the chamber 600, and is typically a ring made from a ceramic material, such as aluminum oxide.

An exemplary backing plate 110 is made from a metal alloy comprising copper-chrome. The resistivity of copper-chrome does not change until its temperatures exceed 600 degrees Celsius, which is sufficiently high to exceed normal sputtering process temperatures. In one implementation, the copper-chrome alloy comprises a ratio of copper to chrome of from about 80:1 to about 165:1. The copper-chrome alloy may comprise copper in a wt. % of from about 98.5 to about 99.1 wt. %, and chrome in a wt. % of from about 0.6 to about 1.2 wt. %. The copper-chrome alloy has a thermal conductivity of about 340 W/mK and an electrical resistivity of about 2.2-µohm cm. In some implementations, the backing plate 110 may be made from the materials disclosed in Table I.

Backing plates 110, 410 may be composed of the backing plate materials disclosed in Table I. Sputtering plates 120, 420 may be composed of the deposition materials disclosed in Table I. The backing plates 110, 410 and sputtering plates 120, 420 may be monolithic or bonded as depicted in the third column of Table I. Bonding of the backing plate to the sputtering plate may be performed by, for example, welding, diffusion bonding, soldering, brazing or forge bonding. The notation Al0.5Cu (wt. %) alloy indicates that the alloy includes 0.5 wt. % copper. As used herein, the term copper includes oxygen-free copper (e.g., C10100—Oxygen-Free Electronic (OFE)—99.99% pure copper with 0.0005% oxygen content, C10200—Oxygen-Free (OF), and C11000—Electrolytic-Tough-Pitch (ETP)).

TABLE I

| Backing Plate Materials | Deposition Materials | Monolithic/ Bonded |
| --- | --- | --- |
| Pure Aluminum | Pure Aluminum | Monolithic |
| Al0.5Cu (wt. %) alloy | Al0.5Cu (wt. %) alloy | Monolithic |
| Al1.0Si (wt. %) alloy | Al1.0Si (wt. %) alloy | Monolithic |
| Al0.5Cu1.0Si (wt. %) alloy | Al0.5Cu1.0Si (wt. %) alloy | Monolithic |
| 6061 Aluminum Alloy | Pure Aluminum | Bonded |
| 6061 Aluminum Alloy | Al0.5Cu (wt. %) alloy | Bonded |
| 6061 Aluminum Alloy | Al1.0Si | Bonded |
| 6061 Aluminum Alloy | Al0.5Cu1.0Si (wt. %) alloy | Bonded |
| Copper or copper chrome | Titanium | Bonded |
| Copper or copper chrome | Tungsten | Bonded |
| Copper or copper chrome | Molybdenum | Bonded |
| Copper or copper chrome | Cobalt | Bonded |
| Copper or copper chrome | Tantalum | Bonded |
| Copper or copper chrome | Li—P—O—N | Bonded |
| Copper or copper chrome | Germanium | Bonded |
| Copper or copper chrome | $GeS_2$ | Bonded |
| Copper or copper chrome | Silicon | Bonded |
| Copper or copper chrome | $SiO_2$ | Bonded |
| Copper or copper chrome | Quartz | Bonded |

The backing plate 110 is typically made from a material selected to have a high thermal conductivity and to circulate a heat transfer fluid therein. A suitably high thermal conductivity of the backing plate 110 is at least about 200 W/mK, for example, from about 220 to about 400 W/mK.

Such thermal conductivity levels allow the sputtering target 100 to be operated for longer process time periods by efficiently dissipating the heat generated in the sputtering target 100. In one implementation, the backing plate 110 is made from a metal, such as copper or aluminum. In another implementation, the backing plate 110 comprises a metal alloy, such as for example copper-zinc (naval brass), or chromium-copper alloy. In one exemplary implementation, the backing plate 110 comprises C18000, which is an alloy having component weights of Cr (0.8%), Cu (96.1%), Ni (2.5%) and Si (0.6%). The backing plate 110 can also be a separate structure containing one or more bonded plates.

The backing plate 110 can also have an electrical resistivity that is in a desirable range to reduce erosion grooving while still allowing operation of the sputtering target 100 for an extended time period. The electrical resistivity should be sufficiently low to allow the sputtering target 100 to be electrically biased or charged during sputtering. However, the electrical resistivity should also be sufficiently high to reduce the effect of eddy currents in the sputtering target 100, as the heat generated by the eddy current as it travels along a pathway through the sputtering target 100 is proportional to the electrical resistance encountered along the pathway. In one implementation, the electrical resistivity of the backing plate 110 is from about 2 to about 5-μohm cm or even from about 2.2 to about 4.1 μohm cm.

In one implementation, the sputtering plate 120 is mounted on the front surface 160 of the backing plate 110 by diffusion bonding by placing the backing plate 110 and the sputtering target 120 on each other and heating the plates to a suitable temperature, typically at least about 200 degrees Celsius. Other exemplary methods for coupling the backing plate 110 to the sputtering plate include soldering, vacuum or hydrogen brazing, diffusion bonding and forge bonding.

In one implementation, the sputtering surface 134 of the sputtering plate 120 is profiled to reduce flaking of process deposits as shown in FIGS. 2 and 5. In an exemplary implementation, the outer peripheral wall 142 forms a peripheral inclined rim 170 that surrounds the top plane 132 of the central cylindrical mesa 130. The inclined rim 170 is inclined relative to a plane perpendicular to the top plane 132 of the central cylindrical mesa 130 by an angle α of at least about 8 degrees (e.g., from about 10 degrees to about 20 degrees; about 15 degrees).

FIG. 4 is a sectional side view of another implementation of a sputtering target 400 that may comprise the materials described in Table I. FIG. 5 is a perspective view of the back of the backing plate of FIG. 4 showing a plurality of intersection circular grooves and arcuate channels on the backside surface 440 of the backing plate 410. The sputtering target 400 comprises a sputtering plate 420 mounted on a backing plate 410. Unlike sputtering target 100, the backing plate 410 is a solid backing plate including a plurality of intersecting circular grooves 450 (450a and 450b) and arcuate channels 454 on the backside surface of the backing plate. In some implementations, the backing plate 410 may be replaced by a flat backing plate that has a flat surface (e.g. does not contain the circular grooves and arcuate channels shown in FIGS. 4 and 5).

The sputtering plate 420 and backing plate 410 can be a monolith comprising a single structure made from the same high-purity material and that serves as both a backing plate and a sputtering plate or they may be separate structures that are bonded together to form a sputtering target. The sputtering plate 420 comprises a central cylindrical mesa 430 that serves as a sputtering surface 434, and which has a top plane 432 that is maintained parallel to the plane of a substrate during use of the sputtering target 400 in a chamber (e.g., chamber 600). The sputtering plate 420 is made from a metal or metal compound. For example, the sputtering plate 420 can be composed of any of the materials identified in Table I.

In one implementation, the sputtering plate 420 is mounted on a backing plate 410 which is a separate structure and which has a front surface 438 to support the sputtering plate 420 and an annular flange 436 that extends beyond the radius of the sputtering plate 420. The annular flange 436 comprises a peripheral circular surface and has outer footing 442 that rests on an isolator 658 in the chamber 600, as shown in FIG. 6. The isolator 658 electrically isolates and separates the backing plate 410 from the chamber 600, and is typically a ring made from a ceramic material, such as aluminum oxide.

An exemplary implementation of a sputtering process chamber 600 capable of processing a substrate 602 using the sputtering target 100 is shown in FIG. 6. The chamber 600 comprises enclosure walls 604 that enclose a plasma zone 606 and include sidewalls 608, a bottom wall 610, and a ceiling 612. The chamber 600 can be a part of a multi-chamber platform (not shown) having a cluster of interconnected chambers connected by a robot arm mechanism that transfers substrates 602 between the chamber. In the implementation shown, the process chamber 600 comprises a sputtering chamber, also called a physical vapor deposition or PVD chamber, which is capable of sputter depositing titanium on a substrate 602. However, the chamber 600 can also be used for other purposes, such as for example, to deposit aluminum, copper, tantalum, tantalum nitride, titanium nitride, tungsten or tungsten nitride; thus, the present claims should not be limited to the exemplary implementations described herein to illustrate the disclosure.

In one implementation, the chamber 600 is equipped with a process kit to adapt the chamber 600 for different processes. The process kit comprises various components that can be removed from the chamber 600, for example, to clean sputtering deposits off the component surfaces, replace or repair eroded components. In one implementation, the process kit comprises a ring assembly 614 for placement about a peripheral wall of the substrate support 620 that terminates before an overhanging edge of the substrate 602, as shown in FIG. 6. The ring assembly 614 comprises a deposition ring 616 and a cover ring 618 that cooperate with one another to reduce formation of sputter deposits on the peripheral walls of the substrate support 620 or the overhanging edge of the substrate 602.

The process kit can also include a shield assembly 624 that encircles the sputtering surface 134 of the sputtering target 100 and the peripheral edge of the substrate support 620, as shown in FIG. 6, to reduce deposition of sputtering deposits on the sidewalls 608 of the chamber 600 and the lower portions of the substrate support 620. As shown in FIG. 6, shield assembly 624 comprises an upper shield 626 and a lower shield 628. Portions of the shield assembly 624, such as for example the upper shield 626, can be biased during substrate processing in order to affect the chamber environment. The shield assembly 624 reduces deposition of sputtering material on the surfaces of the substrate support 620, sidewalls 608 and bottom wall 610 of the chamber 600, by shadowing these surfaces.

The process chamber 600 comprises a substrate support 620 to support the substrate 602, which comprises a pedestal 630. The pedestal 630 has a substrate receiving surface 632 that receives and supports the substrate 602 during processing, the substrate receiving surface 632 having a plane substantially parallel to the sputtering surface 134 of the overhead sputtering target 100. The substrate support 620 can also include an electrostatic chuck 634 to electrostatically hold the substrate 602 and/or a heater (not shown), such as an electrical resistance heater or heat exchanger. In operation, a substrate 602 is introduced into the chamber 600 through a substrate loading inlet (not shown) in the sidewall 608 of the chamber 600 and placed on the substrate support 620. The substrate support 620 can be lifted or lowered to lift and lower the substrate 602 onto the substrate support 620 during placement of a substrate 602 on the substrate support 620. The pedestal 630 can be maintained at an electrically floating potential or grounded during plasma operation.

During a sputtering process, the sputtering target 100, the substrate support 620, and upper shield 626 are electrically biased relative to one another by a power supply 636. The sputtering target 100, the upper shield 626, the substrate support 620, and other chamber components connected to the power supply 636 of the sputtering target operate as a gas energizer to form or sustain a plasma of the sputtering gas. The gas energizer can also include a source coil (not shown) that is powered by the application of a current through the coil. The plasma formed in the plasma zone 606 energetically impinges upon and bombards the sputtering surface 134 of the sputtering target 100 to sputter material off the sputtering surface 134 onto the substrate 602.

The sputtering gas is introduced into the chamber 600 through a gas delivery system 638 that provides gas from a process gas source 640 via conduits 622 having gas flow control valves 644, such as a mass flow controllers, to pass a set flow rate of the gas therethrough. The gases are fed to a mixing manifold (also not shown) in which the gases are mixed to form a process gas composition and fed to a gas distributor 646 having gas outlets in the chamber 600. The process gas source 640 may comprise a non-reactive gas, such as argon or xenon, which is capable of energetically impinging upon and sputtering material from a target. The process gas source 640 may also include a reactive gas, such as one or more of an oxygen-containing gas and a nitrogen-containing gas, that are capable of reacting with the sputtered material to form a layer on the substrate 602. Spent process gas and byproducts are exhausted from the chamber 600 through an exhaust 648, which includes exhaust ports 650 that receive spent process gas and pass the spent gas to an exhaust conduit 652 having a throttle valve 654 to control the pressure of the gas in the chamber 600. The exhaust conduit 652 is connected to one or more exhaust pumps 656. Typically, the pressure of the sputtering gas in the chamber 600 is set to sub-atmospheric levels, such as a vacuum environment, for example, gas pressures of 1 mTorr to 400 mTorr.

The chamber 600 can also include a heat exchanger comprising a housing 660 capable of holding a heat transfer fluid which is mounted abutting the backside surface 140 of the sputtering target 100. The housing 660 comprises walls, which are sealed about the backside surface 140 of the sputtering target 100. The housing 660 can be made from an insulating medium, such as fiberglass. A heat transfer fluid, such as chilled deionized water, is introduced into the housing 660 though an inlet and is removed from the housing 660 through an outlet (not shown). The heat exchanger serves to maintain the sputtering target 100 at lower temperatures to further reduce the possibility of forming erosion grooves and microcracks in the sputtering target 100.

The chamber can also include a magnetic field generator 680 comprising a plurality of rotatable magnets. In one implementation, as shown in FIG. 6, the magnetic field generator 680 comprises two sets of rotatable magnets 662, 664 that are mounted on a common plate 666 and capable of rotating about a central axis in back of the sputtering target 100.

The first set of rotatable magnets 662 comprises one or more central magnets 670 having a first magnetic flux or magnetic field orientation, and one or more peripheral magnets 672 having a second magnetic flux or magnetic field orientation. In one implementation, the ratio of the first magnetic flux to the second magnetic flux is at least about 1:2, for example, from about 1:3 to about 1:8, or even about 1:5. This allows the magnetic field from the peripheral magnets 672 to extend deeper into the chamber 600 towards the substrate 602. In one example, the first set of rotatable magnets 662 comprises a set of central magnets 670 having a first magnetic field orientation, surrounded by a set of peripheral magnets 672 having a second magnetic field orientation. For example, the second magnetic field orientation can be generated by positioning the peripheral magnets 672 so that their polarity direction is opposite to the polarity direction of the central magnets 670.

The implementation of FIG. 6 shows a second, larger set of rotatable magnets 664. The second set of rotatable magnets 664 comprises a central magnet 674 having a first magnetic flux or magnetic field orientation, and a peripheral magnet 676 with a second magnetic flux or magnetic field orientation. In one implementation, the ratio of the first magnetic flux to the second magnetic flux is about 1:1.

The magnetic field generator 680 comprises a motor 682 and axle 684 to rotate the common plate 666 on which the sets of rotatable magnets 662, 664 are mounted. The rotation system rotates the sets of rotatable magnets 662, 664 at from about 60 to about 120 rpm, for example, about 80 to about 100 rpm. In one implementation, the sets of rotatable magnets 662, 664 comprise NdFeB. The first set of rotatable magnets 662 is used to scan the edge of the sputtering target 100 to produce a highly ionized sputter flux. The second set of rotatable magnets 664 can be used to produce a flux of ion bombardment about the central and peripheral regions of the sputtering target 100. The larger, or second set of rotatable magnets 664 can be switched on to clean sputter material redeposited on the sputtering target center and about the periphery. In addition to providing a rotating and changing magnetic field about the sputtering surface 134, the magnetic field generator 680 and sets of rotatable magnets 662, 664 push and stir the heat transfer fluid, thereby circulating a heat transfer fluid in the housing 660.

To counteract the large amount of power delivered to the sputtering target 100, the back of the sputtering target 100 may be sealed to a backside coolant chamber. The backside coolant chamber can be separate from the housing 660, or the coolant chamber and housing 660 can be a single integrated chamber as shown in FIG. 6. Heat transfer fluid 690 comprising, for example, chilled deionized water or other cooling liquid, is circulated through the interior of the coolant chamber to cool the sputtering target 100. The magnetic field generator 680 is typically immersed in the heat transfer fluid 690, and the axle 684 passes through the backside chamber through a rotary seal 686.

The chamber 600 is controlled by a controller 692 that comprises program code having instruction sets to operate components of the chamber 600 to process substrates 602 in the chamber 600. For example, the controller 692 can comprise program code that includes a substrate positioning instruction set to operate the substrate support 620 and substrate transport; a gas flow control instruction set to operate gas flow control valves 644 to set a flow of sputtering gas to the chamber 600; a gas pressure control instruction set to operate the throttle valve 654 to maintain a pressure in the chamber 600; a gas energizer control instruction set to operate the gas energizer to set a gas energizing power level; a temperature control instruction set to control a temperature control system (not shown) in the pedestal 630 or sidewall 608 to set temperatures of the substrate 602 or sidewalls 608, respectively; and a process monitoring instruction set to monitor the process in the chamber 600.

The sputtering process can be used to deposit a layer comprising titanium or a titanium compound on a substrate. The titanium layers can be used by themselves, or in combination with other layers. For example, a sputtered titanium layer can be used as a barrier layer, e.g., Ti/TiN stacked layers are often used as liner barrier layers and to provide contacts to the source and drain of a transistor. In another example, a titanium layer is deposited on a silicon wafer and portions of the titanium layer in contact with the silicon are converted to titanium silicide layers by annealing. In another configuration, the diffusion barrier layer below a metal conductor, includes a titanium oxide layer formed by sputter depositing titanium on the substrate 602 and then transferring the substrate to an oxidizing chamber to oxidize the titanium by heating it in an oxygen environment to form titanium oxide. Titanium oxide can also be deposited by introducing oxygen gas into the chamber while titanium is being sputtered. Titanium nitride can be deposited by reactive sputtering methods by introducing a nitrogen containing gas into the chamber while sputtering titanium.

The present disclosure has been described with reference to certain preferred implementations thereof; however, other implementations are possible. For example, the sputtering plate 120 and backing plate 110 of the sputtering target 100 can be made from materials other than those described herein, and can also have other shapes and sizes. Therefore, the spirit and scope of the appended claims should not be limited to the description of the preferred implementations contained herein.

While the foregoing is directed to implementations of the present disclosure, other and further implementations of the disclosure may be devised without departing from the basic scope thereof, and the scope thereof is determined by the claims that follow.

The invention claimed is:

1. A sputtering target for a sputtering chamber, the sputtering target comprising:
 a circular sputtering plate, comprising:
  a sputtering surface;
  a backside surface opposite the sputtering surface, wherein the backside surface has a radially inner region, a radially middle region, and a radially outer region, the backside surface having:
   a plurality of circular grooves which are spaced apart from one another; and
   at least one channel cutting through the circular grooves and extending from the radially inner region to the radially outer region of the circular sputtering plate;
  an annular back surface opposite the sputtering surface;
  an inclined outer peripheral wall that extends from an outer edge of the sputtering surface to an outer edge of the annular back surface;
  a first inner peripheral wall that extends from the backside surface to an inner edge of the annular back surface, wherein a recess that exposes the backside surface of the circular sputtering plate is defined by the backside surface and the first inner peripheral wall; and
 an annular-shaped backing plate mounted to the circular sputtering plate, wherein the annular-shaped backing plate, comprises:
  an annular-shaped body that defines an open annulus exposing the backside surface of the circular sputtering plate, the annular-shaped body defined by:
   a front surface contacting the annular back surface of the circular sputtering plate;
   an annular flange that extends beyond a radius of the circular sputtering plate, the annular flange comprising a peripheral circular surface having an outer footing operable to rest on a surface; and
   a second inner peripheral wall that extends from an inner edge of the front surface to the annular flange and aligns with the first inner peripheral wall of the circular sputtering plate.

2. The sputtering target of claim 1, wherein the circular grooves are concentric.

3. The sputtering target of claim 2, wherein the circular grooves comprise from about 20 to about 30 grooves.

4. The sputtering target of claim 2, wherein all of the circular grooves are located at the radially middle region of the backside surface.

5. The sputtering target of claim 1, wherein the at least one channel is a linear channel.

6. The sputtering target of claim 5, wherein the linear channel is a plurality of linear channels spaced apart from one another by an angle of from about 30 to about 90 degrees as measured from a center of the backside surface.

7. The sputtering target of claim 1, wherein the annular-shaped backing plate comprises an alloy of copper and chrome.

8. The sputtering target of claim 1, wherein the annular-shaped backing plate comprises a material selected from Al-0.5 wt. % Cu alloy, Al-1.0 wt. % Si alloy, Al-0.5 wt. % Cu-(1.0 wt. % Si) alloy, aluminum, copper, chromium-copper alloy, copper-zinc alloy, and combinations thereof.

9. The sputtering target of claim 8 wherein the circular sputtering plate is composed of titanium or titanium nitride.

10. The sputtering target of claim 1, further comprising a heat exchanger housing capable of holding a heat transfer fluid about the backside surface of the circular sputtering plate, and a plurality of rotatable magnets within the heat exchanger housing.

11. A sputtering chamber, comprising:
 a sputtering target mounted in the sputtering chamber, comprising:
  a circular sputtering plate, comprising:
   a sputtering surface;
   a backside surface opposite the sputtering surface, wherein the backside surface has a radially inner region, a radially middle region, and a radially outer region, the backside surface having:
    a plurality of circular grooves which are spaced apart from one another; and
    at least one channel cutting through the circular grooves and extending from the radially inner region to the radially outer region of the circular sputtering plate;
   an annular back surface opposite the sputtering surface;
   an inclined outer peripheral wall that extends from an outer edge of the sputtering surface to an outer edge of the annular back surface;

a first inner peripheral wall that extends from the backside surface to an inner edge of the annular back surface, wherein a recess that exposes the backside surface of the circular sputtering plate is defined by the backside surface and the first inner peripheral wall; and an annular-shaped backing plate mounted to the circular sputtering plate, wherein the annular-shaped backing plate, comprises:

an annular-shaped body that defines an open annulus exposing the backside surface of the circular sputtering plate, the annular-shaped body defined by:

an annular front surface contacting the annular back surface of the circular sputtering plate;

an annular flange that extends beyond a radius of the circular sputtering plate, the annular flange comprising a peripheral circular surface having an outer footing operable to rest on a surface;

a second inner peripheral wall that extends from an inner edge of the annular front surface to the annular flange and aligns with the first inner peripheral wall of the circular sputtering plate;

a substrate support facing the sputtering target;

a gas distributor to introduce a gas into the sputtering chamber;

a gas energizer to energize the gas to form a plasma to sputter the sputtering target; and a gas exhaust port to exhaust gas from the sputtering chamber.

12. The sputtering chamber of claim 11, wherein the circular grooves are concentric.

13. The sputtering chamber of claim 12, wherein all the circular grooves are located at the radially middle region of the backside surface.

14. The sputtering chamber of claim 11 wherein the at least one channel is a linear channel.

15. The sputtering chamber of claim 14 wherein the linear channel is a plurality of linear channels spaced apart from one another by an angle of from about 30 to about 90 degrees as measured from a center of the backside surface.

16. A magnetron sputtering target assembly for a sputtering chamber, the magnetron sputtering target assembly comprising:

a heat exchanger housing capable of holding a heat transfer fluid about a plurality of rotatable magnets; and a sputtering target abutting the heat exchanger housing such that the heat transfer fluid is capable of contacting a backside surface of the sputtering target, the sputtering target comprising:

a circular sputtering plate, comprising:

a sputtering surface;

the backside surface opposite the sputtering surface, wherein the backside surface has a radially inner region, a radially middle region, and a radially outer region, the backside surface having:

a plurality of circular grooves which are spaced apart from one another; and at least one channel cutting through the circular grooves and extending from the radially inner region to the radially outer region of the circular sputtering plate;

an annular back surface opposite the sputtering surface;

an inclined outer peripheral wall that extends from an outer edge of the sputtering surface to an outer edge of the annular back surface;

a first inner peripheral wall that extends from the backside surface to an inner edge of the annular back surface, wherein a recess that exposes the backside surface of the circular sputtering plate is defined by the backside surface and the first inner peripheral wall; and an annular-shaped backing plate mounted to the circular sputtering plate, wherein the annular-shaped backing plate comprises:

an annular-shaped body that defines an open annulus exposing the backside surface of the circular sputtering plate, the annular-shaped body defined by:

an annular front surface contacting the annular back surface of the circular sputtering plate;

an annular flange that extends beyond a radius of the circular sputtering plate, the annular flange comprising a peripheral circular surface having an outer footing operable to rest on a surface; and a second inner peripheral wall that extends from an inner edge of the annular front surface to the annular flange and aligns with the first inner peripheral wall of the circular sputtering plate.

17. The sputtering chamber of claim 16, wherein the circular grooves are concentric.

18. The sputtering chamber of claim 17, wherein all the circular grooves are located at the radially middle region of the backside surface.

19. The sputtering chamber of claim 16, wherein the at least one channel is a linear channel.

20. The sputtering chamber of claim 19 wherein the linear channel is a plurality of linear channels spaced apart from one another by an angle of from about 30 to about 90 degrees as measured from a center of the backside surface.

* * * * *